United States Patent [19]
Schaenzer

[11] Patent Number: 6,104,556
[45] Date of Patent: Aug. 15, 2000

[54] WIDE WRITE DISC CERTIFICATION PROCESS, APPARATUS AND ARTICLE OF MANUFACTURE

[75] Inventor: Mark James Schaenzer, Eagan, Minn.

[73] Assignee: Seagate Technology, Inc., Scotts Valley, Calif.

[21] Appl. No.: 08/972,603

[22] Filed: Nov. 18, 1997

[51] Int. Cl.$^7$ .............................. G11B 5/02; G01R 33/12
[52] U.S. Cl. .............................................. 360/25; 324/212
[58] Field of Search .................................. 360/25, 31, 53; 369/58, 54; 428/900; 324/212

[56] References Cited

U.S. PATENT DOCUMENTS

| | | | |
|---|---|---|---|
| 4,847,558 | 7/1989 | Fisher et al. ............................. | 324/212 |
| 5,124,849 | 6/1992 | Chur ......................................... | 360/31 |
| 5,461,517 | 10/1995 | Suda et al. ................................ | 360/53 |
| 5,822,139 | 10/1998 | Ayabe ....................................... | 360/31 |

*Primary Examiner*—W. Chris Kim
*Attorney, Agent, or Firm*—Merchant & Gould P.C.

[57] ABSTRACT

A disc certification process, apparatus and article of manufacture for improved testing efficiency employs a testing head having a write element and a read element supported adjacent a rotating disc recording surface. The write element has a width that defines a "wide" write track width of at least N times the read track width defined by the width of the read element, wherein N is an integer greater than 1. The write element writes a signal onto the recording surface of the disc during a first disc rotation, to define a first annular write track having a "wide" first write track width in the radial direction of the disc. Then, during a second rotation, the read element reads the signal written in a first reading track width defined within the "wide" first write track. Thereafter, the read element is stepped to another read position adjacent the first write track and the read element reads the signal written onto the recording surface in a second reading track width defined within the first write track. If the write track width is more than two times the width of each read track, then the read element may be stepped to one or more additional read positions to read the signal written onto the recording surface in one or more further reading track widths defined within the first write track. In this manner, one relatively wide write track is formed with a write track width at least as great as two or more read tracks. The signals read by the read head during the reading steps are analyzed to determine the quality of the recording surface.

20 Claims, 3 Drawing Sheets

WIDE WRITE DISC CERTIFICATION PROCESS, APPARATUS AND ARTICLE OF MANUFACTURE

BACKGROUND OF THE INVENTION

1. Field of the Invention

The present invention relates generally to a recording media certification process, apparatus and article of manufacture and, in preferred embodiments, to such a process, apparatus and article for testing magnetic recording discs, using a wide write head and, preferably, for use with a skip track testing procedure.

2. Related Art

During the manufacture of computer data recording media, such as magnetic recording discs, flaws may be inadvertently formed in the recording surface. Such flaws may include, for example, tiny pinhole-like discontinuities, thinning or other anomalies in the magnetic coating that forms the recording surface. These areas of a disk may not hold a magnetic field pattern reliably and, thus, may be unsuitable for storing data.

In this regard, magnetic recording discs which are used in magnetic disc drives are typically screened, or tested for magnetic defects during or after manufacture. Generally, such certification processes involve electromagnetically writing a signal on the disc and then reading the recorded magnetic signal back. The write signal may be, for example, a standard amplitude sine wave signal, or other suitable testing signal. The signal read back from the disk is then evaluated and, based on certain signal characteristics or quality criteria, a determination is made as to whether or not the disc functioned properly to record the written signal. For example, weak read signals can indicate a defect in the recording surface of the type noted above.

Therefore, a track average amplitude of the signal read back during the testing procedure may be analyzed for defects. If the amplitude drops below a predetermined threshold level, a defect is identified and recorded. The number and length of these amplitude drop-outs are used to certify the quality and acceptability of the disc.

The quality of the recording surface of a disc may be tested in this manner, for example, by writing and reading test tracks on the entire recording surface. However, for purposes of minimizing testing time and maximizing the output of a given tester, procedures are typically implemented for testing only a portion of the disc recording surface. Based on the tested portion, inferences are made regarding the quality of the remaining portion of the recording surface. Thus, were only a fraction of the disc is tested and the total number of defects identified during the test is factored by the area tested versus the total area of the disc.

Two common types of such test procedures are referred to as "spiral testing" and "skip track testing." According to spiral testing procedures, separate read and write heads are mounted on separate linear actuators. The write head is controlled to continuously write a track on the disc and the read head is controlled to read back the signal, as discussed above. However, both the read head and the write head are continuously moved from the outside of the disc to the center of the disc, as the disc is rotatably driven on a spindle, to define a spiral path of motion relative to the disc surface. The ratio of the spindle rotation speed and the linear actuator speed determines the pitch of the spiral. In this manner, the tested portion of the disc comprises a spiral test track extending between the outer peripheral edge of the disc surface and the center hub of the disc.

With skip track testing, a single magnetoresistive (MR) head having both read and write transducers may be used. According to typical skip track testing procedures, the head is controlled such that, during one disc revolution, the write element writes a signal on one track of the disc. On the next revolution the read element reads back the signal recorded during the previous revolution. After the signal is read the head is stepped to the next track location of interest, typically skipping one to two track widths for purposes of minimizing testing time and maximizing tester output, as noted above.

This process may be summarized as follows:

1. Write a track around the circumference of the disc in one complete revolution.

2. Read the previously written track in the next complete revolution.

3. Step to the next track (skipping one or two track widths).

4. Repeat the sequence.

If no tracks are skipped in step 3, then the minimum time required to test a given disk is as follows:

testing time=[(tested width)÷(read track width)]×(time for one revolution)×2 where the "tested width" is equal to the total width of the recording surface (in the radial dimension of the disk) minus the total width of all skipped track widths; and where the "read track width" is the width (in the radial dimension of the disk) of the annular path on the recording surface traced by the read transducer during a reading operation.

Thus, the minimum testing time may be reduced by skipping track widths in step 3 to reduce the "tested width". However, defects in the recording surface locations that were not tested (e.g., the skipped track widths) are not detectable with standard skip track processes. Accordingly, a disc may pass a standard skip track testing procedure, yet include significant undetected defects. On the other hand, attempts to improve the testing accuracy of standard skip track testing processes by eliminating or reducing the number of the skipped track widths, result in increased testing time and, thus, decreased testing efficiency.

Heads which have been used for conventional certification processes have typically been the same type of heads which are designed and used in disc drive products. A generalized representation of a typical MR head configuration 10, having a read element 12 and a write element 14 is shown in FIG. 1. A mid shield 16 and a lower shield 18 are typically provided to shield the read element from spurious electromagnetic energy.

During operation, the head 10 is disposed adjacent a disc recording surface such that, upon rotation of the disc, the head, in effect, sweeps over a portion of the recording surface. For each revolution of the disc, the write element traces out a circular ring on the recording surface of the disc, referred to as the write track or, in disc certification processes, a test track. The read element also traces out a circular ring on the recording surface. The ring traced by the read element is aligned so as to be coincident with a write (or test) track during a read operation. In conventional heads, the read element is typically dimensioned slightly smaller in width than the write element width, such that the ring traced by the read element may be aligned to be fully within a previously recorded write track during a read operation. However, conventional read elements are typically wide enough to cover almost the entire width of a write track, so that data written on the track is not missed by the read element's traced ring.

Disc drives typically use a rotary actuator to step the head across the surface of the disc. To accommodate the rotary actuator the write element may be offset relative to the read element, as shown in FIG. 1 as offset distance D. However, conventional disc certification processes typically use a linear actuator, such that the above-noted offset can cause the read element to be misaligned and/or incompletely cover a test track recorded by the write element. Accordingly, in such conventional processes, minor adjustments to the skew of the certification head are typically necessary, to insure that the read element is properly aligned with respect to the write element (and the write or test track).

To improve the efficiency of disk testing processes, disk certification heads have been proposed with widened read and write elements, for defining widened test tracks. However, as the read element width is increased the sensitivity of the head to small defects tends to be reduced. Typically, defect sizes as small as one micron must be detected during a disk certification procedure. A generalized model for determining the maximum read track width necessary to detect a given defect size may be expressed as follows:

defect size=read track width * (1 - Threshold level), where the "Threshold level" refers to a selected percentage of the track average amplitude. The maximum usable threshold level is generally, for example, 85%. For a defect size of one micron, the above model leads to a maximum read track width of five to six microns.

To increase the aerial density on the discs today, a modem trend is to reduce the track widths. This leads to smaller acceptable defects, which in turn leads to narrower certification heads. However, as the read track width of the certification heads is reduced the certification time tends to increase correspondingly. Accordingly, there is a need in the industry for an improved disk certification process, apparatus and article of manufacture which avoids the above-noted error size detection problems associated with increasing the widths of the read and write elements of a head, and which avoids the efficiency problems associated with reducing the widths of these elements.

SUMMARY OF THE DISCLOSURE

It is an object of preferred embodiments of the present invention to provide a recording media certification process, apparatus and article of manufacture which provides improved testing efficiency, without compromising the testing quality.

It is a further object of preferred embodiments of the present invention to provide such a process, apparatus and article, for testing magnetic recording discs, using a testing head having a write element and a read element supported adjacent a rotating disc recording surface.

In preferred embodiments, the write element has a width that defines a write track width of at least N times the read track width defined by the width of the read element, wherein N is an integer greater than 1. In this regard, relative to the read track width, the write element defines a "wide" write track width.

In accordance with one preferred embodiment, a process of testing a recording surface of a recording disc involves the step of writing a signal onto the recording surface of the disc during a first rotation of the recording surface. The step of writing defines a first annular write track having a "wide" first write track width in the radial direction of the disc. Then, during a second rotation (preferably, but not necessarily the rotation immediately succeeding the above noted "first" rotation), the read element is employed to read the signal written onto the recording surface in a first reading track width defined within the "wide" first write track.

Thereafter, the read element is moved or stepped to another read position adjacent the first write track and, during a further rotation, the read element is employed to read the signal written onto the recording surface in a second reading track width defined within the first write track. If the write track width is more than two times the width of each read track, then the read element may be moved or stepped to one or more additional read positions adjacent the first write track, and the read element is employed to read the signal written onto the recording surface in one or more further reading track widths defined within the first write track. In this manner, one relatively wide write track is formed with a write track width at least as great as two or more read tracks. Therefore, the testing process may be made more efficient by requiring only one writing step for multiple reading steps.

In particular, after a "wide" write track is recorded during a writing step, a first reading step may take place on the next disc revolution. Thereafter, the head need only be stepped to the next read position, whereupon the read element is in position to define a further read track within the wide write track. After multiple read steps are performed (such that multiple read tracks have been defined within the write track), the head may be positioned to define a second write track. Thereafter, multiple read tracks may be defined within the second write track in a manner similar to that discussed above with respect to the first write track.

As a result, a significant increase in testing efficiency may be achieved. In particular, because a new write track need not be recorded for each read step of the testing process, the time required to perform a testing routine may be reduced considerably. For example, a 25% reduction in testing time may be accomplished with a two-to-one write track width to read track width ratio (wherein the write track width contains two read track widths). Furthermore, time efficiency may be increased toward 50% with greater write track width to read track width ratios. By optimizing the ratio of the write element width to the read element width, optimal write track and read track widths may be achieved for optimizing the testing efficiency for a given skip track testing process and a given disc recording surface diameter.

The signals read by the read head during the reading steps are analyzed to determine the quality of the recording surface. In preferred embodiments, the amplitude of the read signal is compared to a predetermined threshold amplitude value. In such embodiments, if the read signal amplitude falls below the threshold value, then a record is made of the location (such as the read track or track portion) at which the signal was read. In further preferred embodiments, the amplitude of the read signal is compared to a predetermined range of amplitude values and a record is made if the read signal falls outside of the predetermined range.

BRIEF DESCRIPTION OF THE DRAWINGS

Referring now to the drawings in which like reference numbers represent corresponding parts throughout.

DETAILED DESCRIPTION OF PREFERRED EMBODIMENTS

In the following description, reference is made to the accompanying drawings which form a part hereof, and which are shown, by way of illustration, several embodiments of the present invention. It is understood that other embodiments may be utilized and structural changes may be made without departing from the scope of the present invention.

As noted above, the present invention relates generally to a recording media certification process, apparatus and article of manufacture and, in preferred embodiments, to such a process, apparatus and article for testing magnetic recording discs, using a wide write head and, preferably, for use with a skip track testing procedure. Preferred embodiments of the present invention are described herein, primarily with reference to a hard disk drive apparatus and magnetic hard disk recording media. However, it will be understood that further embodiments are applicable to other types of recording media having one or more recording tracks, including, but not limited to, floppy discs, optical discs and other optical media, magnetic-optical discs and other magnetic-optical media, magnetic recording tape, magnetic recording cylinders, or the like.

Also, preferred embodiments of the present invention are described herein, primarily with reference to skip track testing procedures. However, it will be understood that further embodiments are applicable to other suitable testing procedures, including, but not limited to, spiral testing or the like.

Figure 1:
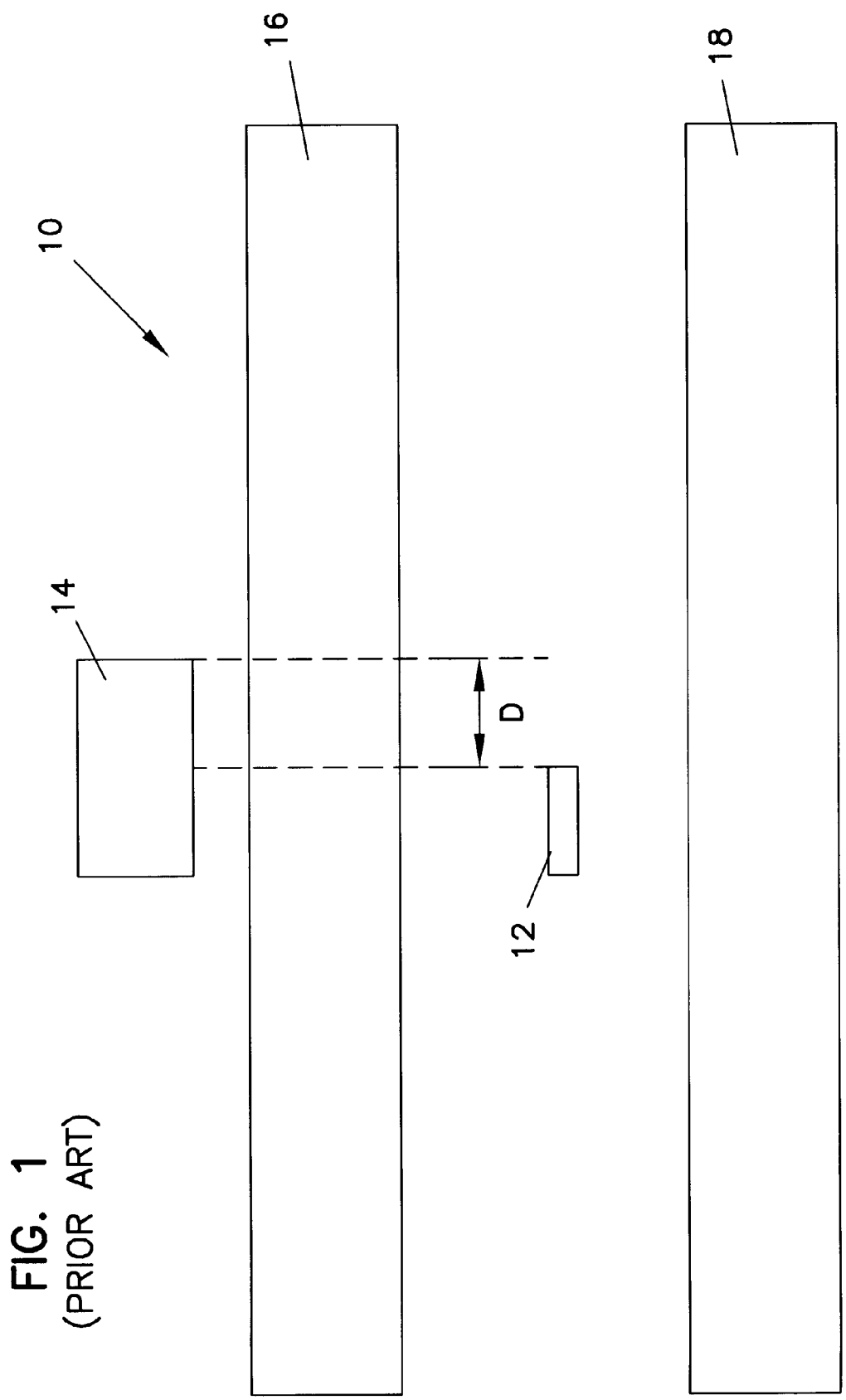
FIG. 1 is a generalized plan view of a conventional read/write head with offset read and write elements.
Figure 2:
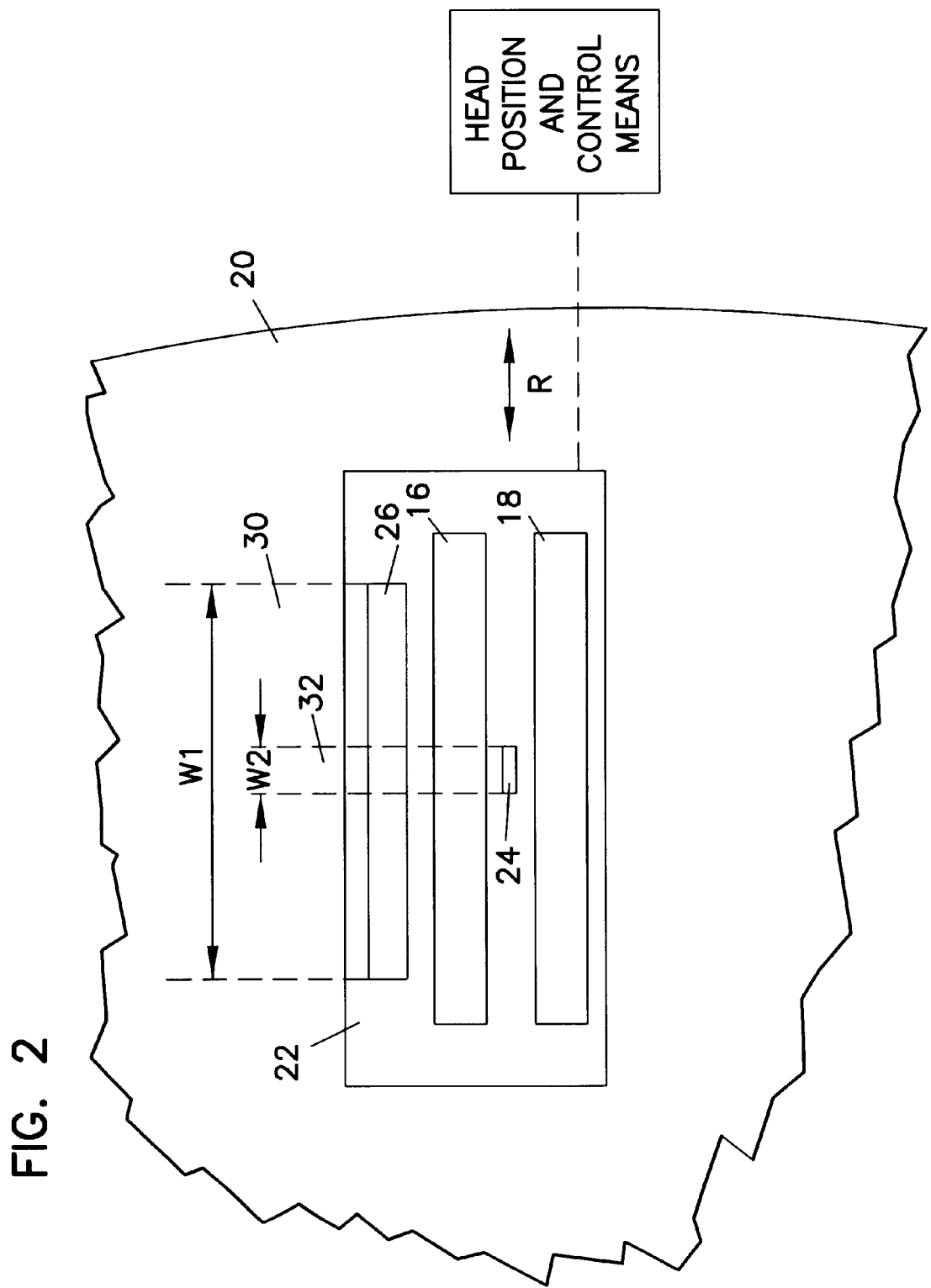
FIG. 2 is a generalized plan view of an MR read/write head according to a preferred embodiment of the present invention.

According to one preferred embodiment, an improved skip track testing apparatus, process and article operates with a magnetic hard disc recording media, such as disc 20 shown in FIG. 2. In the FIG. 2 embodiment, an MR read/write head, generally shown at 22, has a read element 24 and a write element 26. However, unlike the head shown in FIG. 1, the write element 26 of the head 22 has a width dimension which defines a write (or test) track width that encompasses plural read element ring traces, or read tracks. That is, the width of the write element (in the radial dimension of the disc) may be defined in relation to the width of the read element (in the radial dimension of the disc), as being at least twice as wide as the read element width, so as to define a write track which is at least two read track widths (in the radial dimension of the disc). As discussed in more detail below, by virtue of this increased write-element-width-to-read element-width ratio, it is possible to write multiple tracks at one time, to improve testing efficiency, for example, in a skip track testing process or the like.

In FIG. 2, the head 22 is supported by suitable head support structure (not shown) is controlled for movement in the radial direction R of the disc by suitable head positioning and movement control means 28. Details of head support structures and head positioning and control mechanisms are well known in the art and are not described herein for purposes of simplifying the present disclosure.

In the exemplary embodiment of FIG. 2, the head 22 includes a write element 26, which is in the order of ten or eleven times wider (in the radial direction of the disk) than the read element 24. In this manner, the write element 26 defines a write (or test) track 30 having a width WI in the order of ten or eleven times the width W2 of the read element trace (or read track 32). However, as noted above, in further embodiments, the write element may have any suitable width dimension sufficient to define a write track 30 of at least two times the width of the read track 32 defined by the read element. In preferred embodiments, the write track width is between two and about ten times the width of the read track. Modem write heads are fabricated with widths ranging from about 2 $\mu$m up to over 100 $\mu$m. The practical limit and optimization of the track width will depend on the air bearing geometry of the certification head and the inductance of the write element as the width is increased.

The width of the read element is, preferably, selected based on the desired minimum defect size that the test procedure is designed to detect. The model discussed in the background section provides an example relation between read element (or read track) width and the minimum detectable defect size, which can provide a basis for determining the read element width, according to one preferred embodiment. However, other suitable models or means for selecting a read element width may be employed in other embodiments.

In a further preferred embodiments, the width of the read element employed for disc testing and certification is selected to be approximately the same as a standard read element width used in typical data recording and reading operations. In further embodiments, the read element width may be smaller than typical standard widths, for example, to improve the ability to detect smaller defects. However, as the read element width decreases, the time required to test a given disc surface area increases and, thus, testing efficiency decreases. In yet further embodiments, the read element width may be larger than typical standard widths, for example, to increase testing efficiency. However, as noted above, as the read element width increases, the minimum detectable defect size also increases.

Once appropriate read element and write element widths are selected and a head having such read and write elements is positioned and supported adjacent a disc recording surface, a process for testing a disc preferably proceeds as follows. In one disc revolution, a wide write track is recorded by the write element. In a further revolution, such as the next revolution, the read element, positioned over the wide write track, reads back the signal recorded on a read track defined by the read element within the wide write track. The head is then stepped to position the read element to define a further read track within the wide write track, for example, directly adjacent the read track defined in the previous step. The signal recorded on that further read track is read back, preferably in the next revolution of the disc.

For processes employing a write track having a width of N read tracks (where N is an integer), the steps of positioning the read element to define a further read track and reading the signal recorded on the further read track, are repeated another N-1 times. Thus, for example, where N equals 2 (the write track width is equal to about 2 read track widths), the steps of positioning the read element to define a further read track and reading the further read track, is repeated once. Thereafter, a further step of the process would involve stepping the head to position the write element to define a further write track, for example, directly adjacent the previous write track. Alternatively, in accordance with a skip track embodiment, the head may be stepped so as to skip one or more track widths and position the write element to define a further write track spaced apart from the previous writer track by the skipped track width(s). Thereafter, the process is repeated, preferably until the entire recording surface of the disc has been traversed by the head.

Thus, a process employing a wide write track having a width of N read tracks, according to a preferred embodiment of the invention, may be summarized as follows:

1. Write a wide track.
2. Read the written track.
3. Step to the next track location.
4. Read the track.
5. Repeat steps 3 and 4 a total of N-2 additional times.
6. Step to the next track (with or without skipping track widths).
7. Repeat the sequence.

If no tracks are skipped in step 6, then the minimum time required to test a given disk is as follows:

testing time=[(tested width)÷(read track width×N)]×[time for one revolution×(N+1)].

Thus, for a write track width of 2 times the width of the read track (i.e., N=2), the above process becomes:

1. Write a wide track;
2. Read the written track;
3. Step to the next track location;
4. Read the track;
5. Step to the next track (with or without skipping track widths);
6. Repeat the sequence; and the above formula becomes:

testing time=[(tested width)÷(read track width×2)]×[time for one revolution×3].

Comparing the above formula for N=2 to the testing time formula shown in the background section for a standard skip track testing procedure when no tracks are skipped, the minimum testing time for the above N=2 process may be about 25% less than that required by the process described in the background section. Thus, a 25% increase in efficiency may be achieved with a write track width of two times the read track width. Greater testing time efficiencies may be achieved by using wider write elements to define wider write tracks (e.g., N>2).

For example, where N=10, a 45% increase in testing time efficiency may be achieved. As N is increased further, the efficiency increases toward 50%, relative to the testing time formula shown in the background section for a standard skip track testing procedure when no tracks are skipped. Of course skipping tracks (in step 6 of the above process, or in step 3 of the process described in the background section) will increase the testing time efficiency of either of these processes. However, as noted above, when tracks are skipped, the testing accuracy tends to decrease.

The signals read during the reading steps are analyzed, for example, according to well known testing analysis techniques. In one preferred embodiment, the analysis involves comparing the amplitude of the read signal with a predetermined amplitude threshold value and, if the amplitude of the read signal is below the threshold value, then a record is made of the location of the reading track (or reading track portion) at which the below-threshold signal was read. Similarly, the read signal may be compared with a predetermined range of amplitude values, such that, if the read signal amplitude falls outside of the predetermined range, then a record is made of the disc location (reading track or reading track portion) from which the signal was read. Such disc locations may be considered to have substandard recording characteristics and, therefore, the record made of such locations may be used to control future recording operations to avoid recording data at or near those disc locations.

In the above-described preferred embodiments, each write and/or read step is carried out in a single disc revolution. However, in further preferred embodiments, each write and/or read step may be carried out in a plurality of disc revolutions. Of course, as the number of revolutions used to carry out the testing process increases, the time required to carry out the process also increases, thereby, decreasing the time efficiency of the process.

Figure 3:
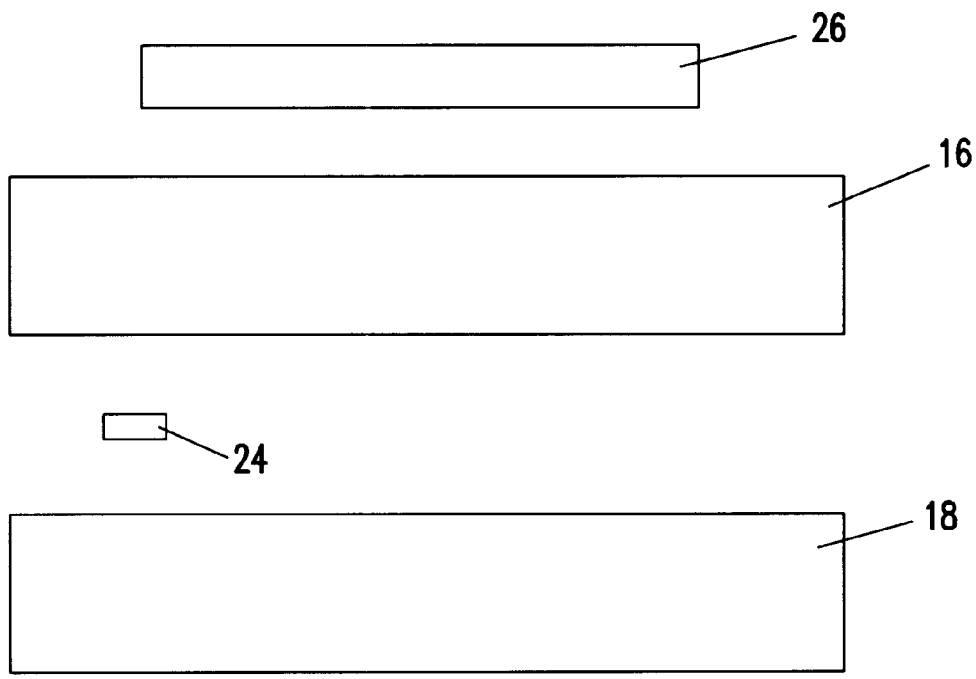
FIG. 3 is a generalized plan view of an MR read/write head according to a further preferred embodiment of the present invention.

While FIG. 2 shows the write element 26 as being centered with respect to the read element 24, in further embodiments, depending on the sequence of the steps in the testing process, it may be more beneficial to offset the write element to either side of the read element, as shown, for example, in FIG. 3. In preferred embodiments, the relative location of the read and write elements and the test sequence are optimized to optimize the total process cycle time. For a test sequence that begins on the inside diameter ID of a disc and proceeds toward the outside diameter OD of the disk, a preferred read element position, relative to the write element, is that in which the read element is located closest to the ID side of the write element. Similarly, for a test sequence that begins on the outside diameter OD of a disc and proceeds toward the inside diameter ID of the disk, a preferred read element position, relative to the write element, is that in which the read element is located closest to the ID side of the write element.

In such preferred embodiments in which read element is offset relative to the write element, the test process may be further simplified in that, as the head is stepped to incrementally step the read element across the pre-written write track (e.g., steps 2–4 in the above processes), the write element is also stepped toward the next write track position (provided the read and write elements are disposed within the same head). Thus, at the end of the write track the write element is already in position (or at least, near a position) to write a fresh wide track on the surface of the disc.

In preferred embodiments as described above, the read element and the write element are disposed within the same head structure, and the position of the head structure is controlled by the control means 28 to provide, for example, a stepped motion of the head structure across the disc surface, which effects a corresponding stepped motion of both the read and write elements. However, in further embodiments, the read element and the write element may be disposed in separate head structures and may be stepped across the disc surface together or, in further preferred embodiments, separately.

Therefore, as described above, by increasing the ratio of the write track width to the read track width, test time efficiency may be significantly improved. Also, by using a wide write element, problems discussed in the background section associated with the alignment and read-to-write element offset are minimized or eliminated. Further advantages, such as avoiding adverse "edge effects" associated with the rounding of magnetic transitions at the inner and outer diameter edges of a write track.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A process of increasing the testing efficiency of a recording surface of a recording disc, the process comprising:

a. supporting at least one head having a read element and a write element adjacent a recording surface of a recording disc;

b. providing relative rotational motion between the recording surface and the at least one head;

c. writing a signal onto the recording surface of the disc during a first rotation of the recording surface, to thereby define a first annular write track having a first write track width in the radial direction of the disc;

d. reading the signal written onto the recording surface in a first reading track width defined within said first write track width by the reading element during a second rotation of the disc wherein the first reading track has a track width less than the first write track width;

e. reading the signal written onto the recording surface in a second reading track width defined within said first write track width by the reading element during a third rotation of the disc wherein the second track width has a track width less than the first write track width and the second reading track width does not overlap the first reading track width; and f. analyzing the signals read in each of steps d. and e.

2. A process as recited in claim 1, wherein said step of supporting comprises the step of supporting a write element having a width at least N times larger than the width of the read element, such that said step of writing defines a first write track width which is at least N times larger than the width of each of said first and second read tracks, wherein N is an integer greater than 1.

3. A process as recited in claim 1, wherein said first write track width is at least as wide as the combined first and second reading track widths.

4. A process as recited in claim 1, wherein said step of analyzing comprises the step of comparing the amplitude of the signal read in each reading step with a predetermined threshold amplitude value.

5. A process as recited in claim 4, wherein said step of analyzing further comprises the step of recording instances in which the amplitude of the signal read in each reading step falls below the threshold amplitude value.

6. A process as recited in claim 1, wherein said step of analyzing comprises the steps of:

comparing the amplitude of the signal read in each reading step with a predetermined range of amplitude values; and recording instances in which the amplitude of the signal read in each reading step falls outside of the predetermined range of amplitude values.

7. A process as recited in claim 1, wherein, between steps d. and e., said process further comprises the step of moving the read element from a first position along the radial dimension of the disc, at which the reading element defines the first reading track width within the first write track, to a second position along the radial dimension of the disc, at which the reading element defines the second reading track width within the first write track.

8. A process as recited in claim 1, further comprising the steps of:

g. writing a signal onto the recording surface of the disc during a further rotation of the recording surface, to thereby define a second annular write track having a second write track width in the radial direction of the disc, said second write track width being substantially equal to the first write track width;

h. reading the signal written onto the recording surface in a first reading track width defined within said second write track width of recording surface by the reading element during yet a further rotation of the disc;

i. reading the signal written onto the recording surface in a second reading track width defined within said second write track width of recording surface by the reading element during yet a further rotation of the disc; and j. analyzing the signals read in each of steps h. and i.

9. A process as recited in claim 8, wherein, before step g., said process further comprises the step of moving the write element from a first write element position along the radial dimension of the disc, at which the write element defines the first annular write track, to a second write element position along the radial dimension of the disc, at which the write element defines the second annular write track.

10. A process as recited in claim 8, wherein:

between steps d. and e., said process further comprises the step of moving the read element from a first position along the radial dimension of the disc, at which the reading element defines the first reading track width within the first write track, to a second position along the radial dimension of the disc, at which the reading element defines the second reading track width within the first write track;

between steps g and h., said process further comprises the step of moving the read element from the second read element position to a third position along the radial dimension of the disc, at which the reading element defines the first reading track width within the second write track; and between steps h. and i., said process further comprises the step of moving the read element from the third read element position to a fourth position along the radial dimension of the disc, at which the reading element defines the second reading track width within the second write track.

11. A process as recited in claim 8, wherein, before step g., said process further comprises the step of moving the write element from a first write element position along the radial dimension of the disc, at which the write element defines the first annular write track, to a second write element position along the radial dimension of the disc, at which the write element defines the second annular write track.

12. A process of testing a recording surface of a recording disc, the process comprising:

a. supporting at least one head having a read element and a write element adjacent a recording surface of a recording disc;

b. providing relative rotational motion between the recording surface and the at least one head;

c. writing a signal onto the recording surface of the disc during a first rotation of the recording surface, to thereby define a first annular write track having a first write track width in the radial direction of the disc;

d. reading the signal written onto the recording surface in a first reading track within said first write track width of recording surface by the reading element during a second rotation of the disc, said first reading track having a reading track width of no more than 1/N times the first write track width, wherein N is an integer greater than 1;

e. moving the read element from a position along the radial dimension of the disc, at which the reading element defines the reading track of the most recent reading step, to a further read element position along the radial dimension of the disc, at which the reading element defines a further reading track width within the first write track wherein the further reading track width does not overlap the first reading track width;

f. reading the signal written onto the recording surface in the further reading track by the reading element during a further rotation of the disc, said further reading track having a reading track width of no more than 1/N times the width of the first write track;

g. repeating steps e. and f., N-2 additional times; and h. analyzing the signals read in each of the reading steps.

13. A process as recited in claim 12, wherein said step of supporting comprises the step of supporting a write element having a width at least N times larger than the width of the read element, such that said step of writing defines a first write track width which is at least N times larger than the width of each of said first and second read tracks, wherein N is an integer greater than 1.

14. A process as recited in claim 12, wherein said step of analyzing comprises the step of comparing the amplitude of the signal read in each reading step with a predetermined threshold amplitude value.

15. A process as recited in claim 14, wherein said step of analyzing further comprises the step of recording instances in which the amplitude of the signal read in each reading step falls below the threshold amplitude value.

16. A process as recited in claim 12, wherein said step of analyzing comprises the steps of:

comparing the amplitude of the signal read in each reading step with a predetermined range of amplitude values; and recording instances in which the amplitude of the signal read in each reading step falls outside of the predetermined range of amplitude values.

17. A process as recited in claim 12, further comprising the steps of:

i. writing a signal onto the recording surface of the disc during yet a further rotation of the recording surface, to thereby define a second annular write track having a second write track width in the radial direction of the disc;

j. reading the signal written onto the recording surface in a first reading track within said second write track width of recording surface by the reading element during yet a further rotation of the disc, said first reading track having a reading track width of no more than 1/N times the second write track width, wherein N is an integer greater than 1;

k. moving the read element from a position along the radial dimension of the disc, at which the reading element defines the reading track of the most recent reading step, to a further read element position along the radial dimension of the disc, at which the reading element defines a further reading track width within the second write track;

l. reading the signal written onto the recording surface in the further reading track by the reading element during yet a further rotation of the disc, said further reading track having a reading track width of no more than 1/N times the width of the second write track;

m. repeating steps k. and l., N-2 additional times.

18. A process as recited in claim 14, wherein, between steps c. and i., said process further comprises the step of moving the write element from a first write element position along the radial dimension of the disc, at which the write element defines the first annular write track, to a second write element position along the radial dimension of the disc, at which the write element defines the second annular write track.

19. Apparatus for testing a recording surface of a rotating recording disc, the apparatus comprising:

at least one head supporting a write element and a read element adjacent the recording surface of the rotating recording disc, said write and read elements having widths defining write and read track widths, respectively, wherein the write element width defines a write track width of at least N times larger than the width of the read track defined by the read element width, wherein N is an integer greater than 1;

means for writing a signal onto the recording surface of the disc during a first rotation of the recording surface, to thereby define a first annular write track having a write track width in the radial direction of the disc;

means for reading the signal written onto the recording surface in a first reading track within said write track width of recording surface by the reading element during a second rotation of the disc, said first reading track having a reading track width of no more than 1/N times the first write track width;

means for moving the read element from a position along the radial dimension of the disc, at which the reading element defines the first reading track, to a further read element position along the radial dimension of the disc, at which the reading element defines a further reading track width within the first write track wherein the further reading track does not overlap the first reading track width;

said reading means including means for reading the signal written onto the recording surface in the further reading track by the reading element during a further rotation of the disc, said further reading track having a reading track width of no more than 1/N times the width of the first write track;

means for analyzing the signals read by said reading means.

20. Apparatus as recited in claim 19, wherein said means for analyzing comprises means for comparing the amplitude of the signal read by said reading means with a predetermined amplitude value; and recording instances in which the amplitude of the read signal read traverses the predetermined threshold amplitude value.

* * * * *